(12) United States Patent
Mozdzen

(10) Patent No.: US 7,289,382 B2
(45) Date of Patent: Oct. 30, 2007

(54) REWRITABLE FUSE MEMORY

(75) Inventor: Thomas J. Mozdzen, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 322 days.

(21) Appl. No.: 10/744,664

(22) Filed: Dec. 23, 2003

(65) Prior Publication Data
US 2005/0135170 A1 Jun. 23, 2005

(51) Int. Cl.
*G11C 7/00* (2006.01)
(52) U.S. Cl. .................. 365/225.7; 365/210
(58) Field of Classification Search ......... 365/225.7, 365/210
See application file for complete search history.

(56) References Cited
U.S. PATENT DOCUMENTS

| | | | | |
|---|---|---|---|---|
| 4,773,046 A * | 9/1988 | Akaogi et al. | ............. | 714/718 |
| 5,966,339 A * | 10/1999 | Hsu et al. | ............. | 365/225.7 |
| 6,259,636 B1 * | 7/2001 | Fukuda et al. | ............. | 365/200 |
| 6,310,809 B1 * | 10/2001 | Roohparvar et al. | ........ | 365/203 |
| 6,392,468 B1 * | 5/2002 | Wu | ............. | 327/525 |
| 6,601,194 B1 * | 7/2003 | Dahn et al. | ............. | 714/42 |
| 6,639,863 B2 * | 10/2003 | Imamura et al. | ........ | 365/225.7 |
| 6,789,238 B2 * | 9/2004 | Swanson et al. | ............. | 716/4 |
| 6,839,292 B2 * | 1/2005 | Gatzemeier et al. | ........ | 365/200 |
| 6,972,587 B2 * | 12/2005 | Zimlich | ............. | 326/10 |
| 7,050,349 B2 * | 5/2006 | Tanizaki | ............. | 365/255.7 |

* cited by examiner

*Primary Examiner*—Michael Tran
(74) *Attorney, Agent, or Firm*—Trop, Pruner & Hu, P.C.

(57) ABSTRACT

An apparatus includes a first fuse, a second fuse and a circuit. The circuit uses the first fuse to indicate a stored value for a fuse memory location, and in response to the fuse memory location being rewritten, the circuit uses the second fuse to indicate the stored value for the fuse memory location.

30 Claims, 5 Drawing Sheets

REWRITABLE FUSE MEMORY

BACKGROUND

The invention generally relates to a rewritable fuse memory.

It is often desirable to permanently store information or form permanent connections in a semiconductor integrated circuit after the integrated circuit has been fabricated. A fuse is a programmable storage device that may be used to accomplish these goals. More specifically, the integrated circuit may have a number of fuses that collectively form the storage elements of a fuse memory. The fuse memory may be programmed to configure the integrated circuit for purposes of adjusting operating parameters (an operating frequency, for example) of the integrated circuit, designating defective memory cells, indicating a die identification number, indicating program instructions, indicating configuration information, etc.

A typical fuse has either a low resistance state or a high resistance state, and it is through these states that the fuse indicates respective logical states. For example, a typical fuse may exhibit a low resistance state (indicative of a logic zero, for example) before being programmed, and after being programmed, the fuse may be "blown" so that the fuse exhibits a high resistance state (indicative of a logic one, for example). A type of fuse called an antifuse may exhibit the opposite properties: a high resistance state before being programmed and a low resistance state after being programmed.

Fuses typically are one time programmable (OTP) devices, a designation that means once programmed, the fuses cannot be reprogrammed. Although configuration and option information stored in a memory of the integrated circuit may be considered "permanent" relative to the life of the integrated circuit, it may be desirable to change information at least once. For example, an original equipment manufacturer (OEM) may want to overwrite information stored on the integrated circuit by the fabricator of the circuit. Therefore, fuse memories are often not used if potential reprogramming of the fuse memory is contemplated. Other types of memories (an electrically erasable programmable read only memory (EEPROM) or a flash memory, as examples) may alternatively be used. However, these memories may be relatively more expensive and may consume more die area than a fuse memory.

Thus, there is a continuing need for an arrangement and/or technique to improve upon memory storage for an integrated circuit.

DETAILED DESCRIPTION

Figure 1:
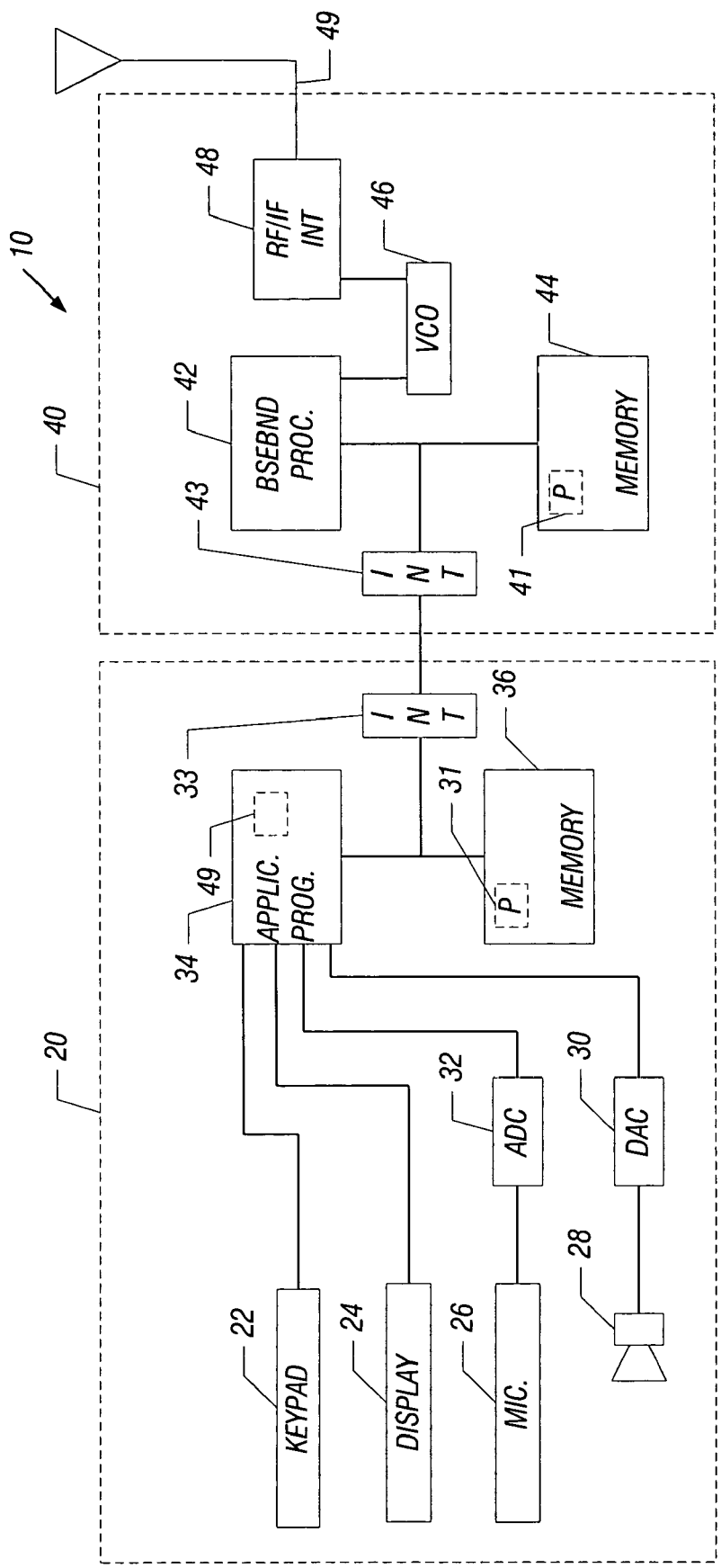
FIG. 1 is a schematic diagram of a portable computing or communication device according to an embodiment of the invention.

Referring to FIG. 1, an embodiment of a portable computing or communication device (called a "portable device 10" herein) in accordance with the invention includes a rewritable fuse memory 49. As described below, the fuse memory 49, in some embodiments of the invention, has multiple addressable memory locations that may store data that is used for numerous purposes for the portable device 10. As examples, the fuse memory 49 may be used for purposes of storing data to adjust operating parameters (an operating frequency, for example), designate defective memory cells, indicate a die identification number, indicate program instructions, indicate configuration information, etc. Each addressable memory location may, in some embodiments of the invention, store a predefined unit (a unit of one or more words, for example) of data.

The fuse memory 49 uses fuses, one time programmable (OTP) storage elements, as the data storage elements for the memory 49. Thus, each memory location of the fuse memory 49 relies on programmed fuses to store the data for the location. Although a particular memory location may store a data value using fuses that cannot be reprogrammed, should the memory location need to be rewritten with a new value, a multiplexing mechanism (described below) of the fuse memory 49 switches out the old set of fuses (storing the old data value) with a new set of fuses that are then programmed to store the new value.

As a more specific example, the portable device 10 may be a one-way pager, a two-way pager, a personal communication system (PCS), a personal digital assistant (PDA), a cellular telephone, a portable computer, etc. Although the fuse memory 49 is described herein as being part of an application processor 34 of a portable device 10, it is understood that in other embodiments of the invention, the fuse memory 49 may be separate from a processor and may be located in a device or system other than a portable device.

The portable device 10 includes an application subsystem 20 and a communication subsystem 40. The application subsystem 20 provides features and capabilities that are visible and/or used by a user of the portable device 10. For example, the application subsystem 20 may be used for purposes of email, calendaring, audio, video, gaming, etc. The communication subsystem 40 may be used for purposes of providing wireless and/or wired communication with wired/wireless networks, cellular networks, wireless local area networks, etc.

For the case in which the portable device 10 is a cellular telephone, the application subsystem 20 may provide an interface to the user of the cellular telephone and thus, provide a keypad 22 which the user may use to enter instructions and telephone numbers into the cellular telephone; a display 24 for displaying command options, caller information, telephone numbers, etc.; and a microphone 26 for sensing commands and/or voice data from the user. The microphone 26 thus, may provide an analog signal indicative of a voice signal, and this analog signal may be converted into a digital format by an analog-to-digital converter (ADC) 32. The digital data from the ADC 32, in turn, is provided to the application processor 34, another component of the application subsystem 20. Likewise, data from the keypad 22 may also be provided to the application processor 34. Graphical data may be provided by the application processor 34 to the display 24 for viewing by the user of the cellular telephone.

Among the other features of the application subsystem 20, the subsystem 20 may include a speaker 28 that receives an analog signal from a digital-to-analog converter (DAC) 30 that, in turn, receives digital data from the application processor 34. For example, the speaker 28 may be used to provide an audible ringing signal to the user, for the case in which the device 10 is a cellular telephone, as well as provide an audio stream for audio data that is provided by a cellular network, for example.

The application subsystem 20 may also include a memory 36. As an example, this memory 36 may be a dynamic random access memory (DRAM) or a flash memory, as just a few examples. The memory 36 is coupled to the application processor 34 for purposes of storing data and/or program instructions 31 (operating system code, application code, etc.) that is executed by the application processor 34.

The application subsystem 20 represents an application subsystem for one out of many different embodiments for the portable device 10. Thus, in some embodiments of the invention, the application subsystem 20 may include different and/or additional components, such as a camera, an external data port, a global positioning system (GPS) receiver, etc., as just a few examples.

In some embodiments of the invention, the communication subsystem 40 includes a baseband processor 42 that establishes the particular communication standard for the portable device 10. For example, if the portable device 10 is a cellular telephone, then the communication subsystem 40 provides a cellular network interface, a wireless interface, for the portable device 10. For this wireless interface, the baseband processor 42 may establish a code division multiple access (CDMA) cellular radiotelephone communication system, or a wide-band CDMA (W-CDMA) radiotelephone communication system, as just a few examples. The W-CDMA specifically has been proposed as a solution to third generation ("3G") by the European Telecommunications Standards Institute (ETSI) as their proposal to the International Telecommunication Union (ITU) for International Mobile Telecommunications (IMT)-2000 for Future Public Land Mobile Telecommunications Systems (FPLMTS).

The baseband processor 42 is coupled to other components of the wireless interface (in accordance with some embodiments of the invention), including an antenna 49 and a radio frequency/intermediate frequency (RF/IF) interface 48 that forms an analog interface for communicating with the antenna 49. A voltage controlled oscillator (VCO) 46 is coupled to the RF/IF interface 48 to provide signals having the appropriate frequencies for modulation and demodulation, and the baseband processor 42 controls the VCO 46 to regulate these frequencies, in some embodiments of the invention.

Among the other features of the communication subsystem 40, in some embodiments of the invention, the subsystem 40 may include a memory 44 (a DRAM memory or a flash memory, as a few examples) that is coupled to the baseband processor 42. The memory 44 may store program instructions 41 and/or data.

The processor 34 or 42 may include one or more microprocessors, such as a Pentium® microprocessor, for example. In some embodiments of the invention, the baseband processor 42 may be a digital signal processing (DSP) engine. Other and different processors may be used for the application 34 and baseband 42 processors in other embodiments of the invention.

Figure 2:
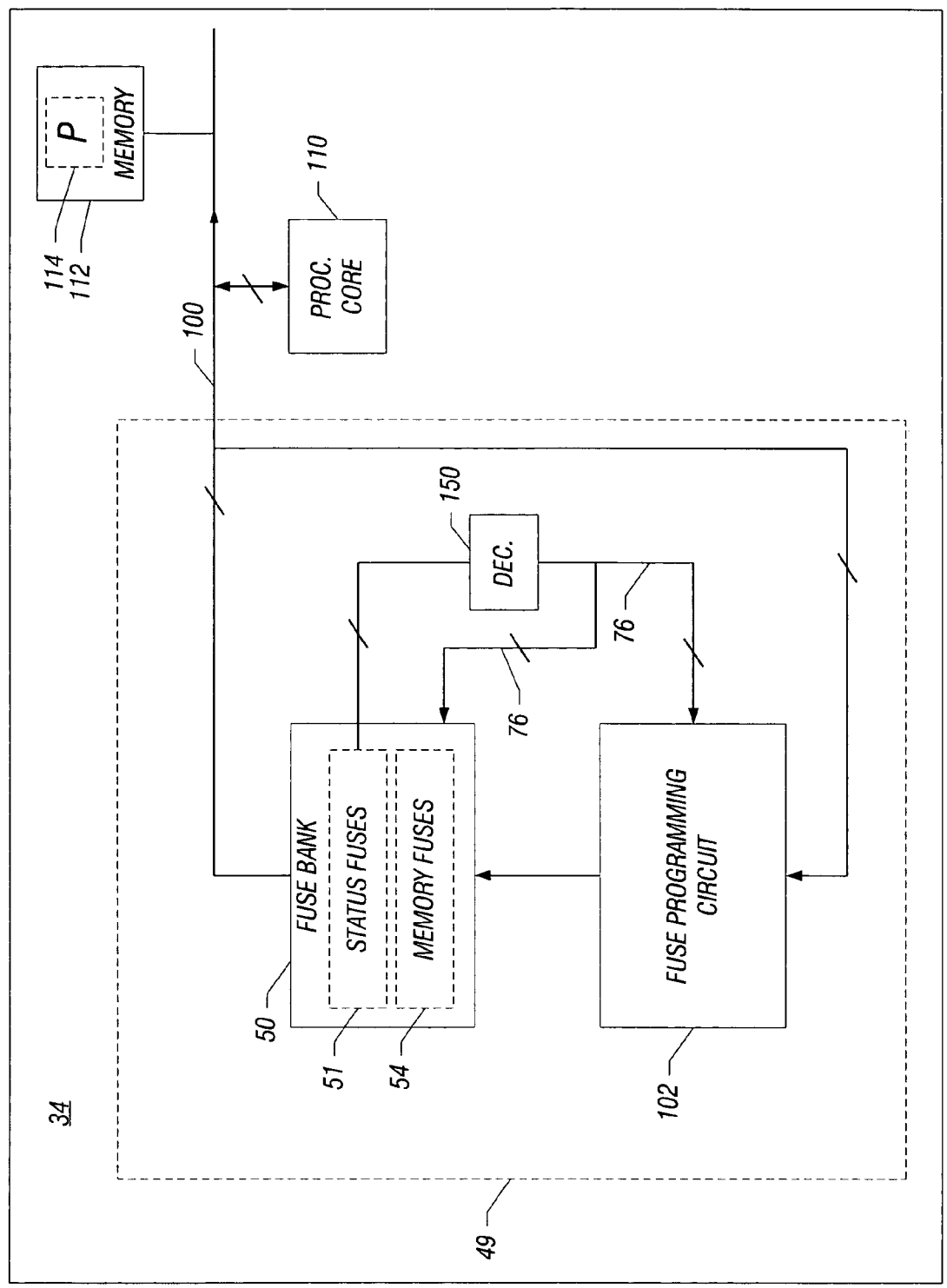
FIG. 2 is a block diagram of fuse circuitry of the application processor of FIG. 1 according to an embodiment of the invention.

Referring to FIG. 2, in some embodiments of the invention, the fuse memory 49 may include a fuse bank 50 that includes one time programmable (OTP) fuses that are capable of being programmed to store values for addressable memory locations of the fuse bank 50. For example, in some embodiments of the invention, each fuse may be a polysilicon fuse that, when unprogrammed, exhibits a relatively low resistance; and when the fuse is programmed, the fuse is blown so that the fuse exhibits a relatively higher resistance. Other variations are possible and are within the scope of the invention. For example, in some embodiments of the invention, each fuse may be an antifuse that exhibits a relatively high resistance when unprogrammed and a relatively lower resistance when programmed. Furthermore, in some embodiments of the invention, the fuses may not all be of the same type. For example, some of the fuses may be antifuses, some of the fuses may be made from polysilicon, some of the fuses may be made from semiconductor materials other than polysilicon, some of the fuses may exhibit opposite states than antifuses, etc.

In some embodiments of the invention, the fuse bank 50 includes memory fuses 54 and status fuses 51. The memory fuses 54 fall into three categories: spare fuses that have never been programmed; active programmed fuses that are used to indicate stored values for one or more memory locations of the fuse memory 49; and inactive programmed fuses that once were active programmed fuses (i.e., fuses that once indicated stored values for one or more fuse memory locations) but now no longer indicate stored values for any of the memory locations of the fuse memory 49. The status fuses 51 are programmed for purposes of labeling the memory fuses 54 as belonging to one of the three above-described groups. As described below, each status fuse 51 may be associated with (and thus, label) more than memory fuse 54; and as a more specific example, in some embodiments of the invention, each status fuse 51 may be associated with the number of fuses needed to store a value for a particular memory location.

In addition to the fuse bank 50, in some embodiments of the invention, the fuse memory 49 includes a fuse programming circuit 102, a circuit that provides selection signals and appropriate programming currents/voltages for purposes of programming selected (selected via the selection signals) memory locations of the fuse bank 50. The fuse programming circuit 102 is activated in response to a write operation occurring over a fuse bus 100.

More specifically, the fuse bus 100 communicates various control, data and address signals associated with read and write operations that occur over the fuse memory 49. In this manner, for a particular write operation, the fuse bus 100 communicates address signals identifying a targeted fuse memory location to which data is to be stored; data signals indicating the data; and control signals controlling the general flow of the write operation. For a read operation, the fuse bus 100 communicates address signals identifying the targeted fuse memory location from which data is to be retrieved; controls signals that control the read operation; and data signals that indicate the data from the targeted memory location. In some embodiments of the invention, the fuse bus 100 is a wide data bus in that all of the data for the targeted memory location being read from or written to is communicated at the same time over the bus.

In response to a write operation, the fuse programming circuit 102 communicates with the fuse bank 50 to select and program a set of previously unprogrammed memory fuses 54 to indicate the value communicated via the write operation.

As stated above, the write operation identifies the targeted memory location. The fuse programming circuit 102 determines, for the targeted memory location, which set of fuses 54 are to be programmed. For purposes of identifying these fuses, the fuse memory 49 includes a decoder 150. The decoder 150 provides select signals 76 that identify a set of unprogrammed memory fuses 54 to be programmed by the fuse programming circuit 102, as described below. The select signals 76 are also received by the fuse bank 50 for purposes of reading data from the fuse bank 50, as also described below.

In some embodiments of the invention, the decoder 150 is connected to the status fuses 51 for purposes of generating the select signals 76. Each time the fuse programming circuit 102 programs a particular set of fuses for an associated fuse memory location, the fuse programming circuit 102 also updates the status fuses 51 to cause the decoder 150 to update the select signals 76. Due to this update to the select signals 76, the correct set of fuses 54 is identified for subsequent read operations; and the fuse programming circuit 102 selects another unprogrammed set of fuses if the same memory location is rewritten. Thus, the status fuses 51 are changed each time a write operation occurs to change the status of an active set of program fuses (the set of fuses storing the value for the memory location before the write operation occurs) to "inactive" and change the status of a previously unprogrammed set of fuses (the set of fuses storing the new value for the memory location) to "active."

In some embodiments of the invention, the application processor 34 includes a processing core 110 (an instruction unit, addressing unit, etc., of the processor 34) that may initiate a write operation over the fuse bus 100. In some embodiments of the invention, the processor core 110 is essentially unaware of the multiplexing being performed by the fuse memory 49. In other words, from the processor core's perspective, it appears that each fuse memory location is rewritable, as no special operation is required by the processor core 110 for purposes of rewriting a particular fuse memory location. However, in other embodiments of the invention, the processor core 110 may be involved in selecting the next set of fuse memory locations to be programmed for a particular memory location. For these embodiments of the invention, the processing core 110 may, for example, communicate with a fuse programming circuit 102 to cause the circuit 102 to specifically address a particular status fuse 51 and program that status fuse 51 accordingly. Other variations are possible.

In some embodiments of the invention, the application processor 34 may include a memory 112 (a read only memory (ROM, for example)) that stores program instructions 114 that cause a processor core 110 to rewrite particular fuse memory locations. For example, the instructions 114 may cause the processor core 110 to change certain configuration options of the portable device 10. The instructions 114 may also the processor core 110 to change values stored in particular fuse memory locations for purposes of updating configuration information for the portable device 10, designating bad memory cells, changing the identification of the portable device 10, etc.

In some embodiments of the invention, the program instructions 114 may place the processing core 110 in a mode designated for allowing write operations to occur over the fuse memory bus 100 and possibly causing one or more fuse memory locations to be rewritten. In some embodiments of the invention, the processing core 110 (and any other device) cannot write to the fuse memory 49 unless the core 110 is placed in this designated mode. For example, in some embodiments of the invention, the portable device 10 may be programmed either at the manufacturer of the application processor 34 facility that fabricates the application processor 34 or at an original equipment manufacturer (OEM) facility that incorporates the application processor 34 into the portable device 10. Regardless of the particular entity that initiates the writes to the fuse memory 49, when the application processor 34 is placed in the designated mode, write operations may occur over the fuse bus 100 for purposes of storing or modifying (i.e., rewriting) values in the fuse memory 49.

Figure 3:
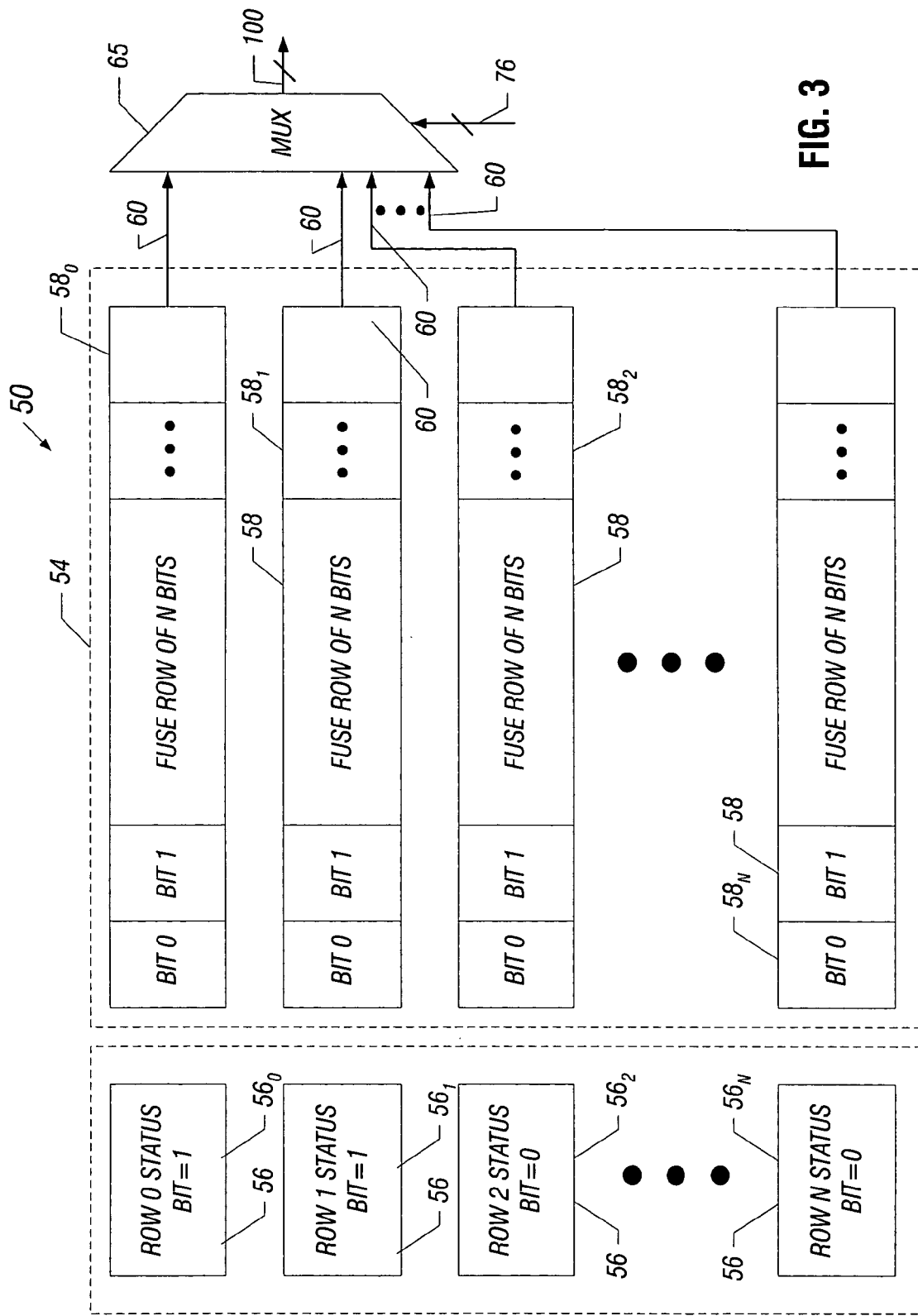
FIG. 3 is a schematic diagram of a fuse bank of FIG. 2 according to an embodiment of the invention.

In some embodiments of the invention, the value for each fuse memory location is indicated by an active row of fuses. Referring to FIG. 3, more specifically, in some embodiments of the invention, the memory fuses 54 may include N rows 58 (rows $58_0$, $58_1$, $58_2$ ... $58_N$), each one of which includes N fuses. The memory fuses 54 may include more or less than N rows, in other embodiments of the invention. One of the fuse rows 58 is active and thus, indicates the stored value for a particular fuse memory location. Thus, each fuse of the selected row 58 indicates a particular bit for the fuse memory location.

For purposes of simplifying the following description, only the rows 58 and circuitry that are associated with a single fuse memory location are depicted in FIG. 3 and described below. However, the fuse memory 49, in some embodiments of the invention, includes similar circuitry for each of a plurality of memory locations. For example, each memory location includes a set of fuses, such as the fuses that are depicted in FIG. 3; and the decoder 150 (FIG. 2) for these fuses is activated in response to a read or write operation targeting the memory location.

Each fuse row 58 is associated with a particular status fuse 56 (part of the status fuses 51) that indicates the programming status of the row 58. For example, the row $58_0$ is associated with the status fuse $56_0$. Likewise, as another example, the row $58_2$ is associated with the status fuse $56_2$.

In some embodiments of the invention, each status fuse 56 has a default state (a state indicating a logic zero, for example) when the associated row 58 (and the status fuse 56 itself) has never been programmed. The fuse memory 49 includes sensing read circuitry (not shown) to interpret the unprogrammed state of the status fuse 56 as being either a logic one state or a logic zero state (the state assumed, for purposes of discussion below). When the fuse programming circuit 102 (FIG. 2) programs the associated row 58, the circuit 102 also programs the associated status fuse 56 so that the fuse 56 has a different logic value (a logic value of one, for example) to indicate the associated row 58 has been programmed.

As a more specific example, FIG. 3 depicts an exemplary state of the fuses. In this example, rows $58_0$ and $58_1$ have been programmed. Thus, the associated fuses $56_0$ and $56_1$ are set to the state (a logic one state, for example) to indicate that these rows 58 have been programmed. In some embodiments of the invention, the rows 58 are programmed in a sequential manner so that the row $58_0$ is programmed first, row $58_1$ is programmed second, etc. Thus, by examining the status of fuses 56, it can be determined which is the last programmed row 58. It is this last programmed row that serves as the current active row so that indications of the fuses of this row 58 indicates the stored value for the fuse memory location. In the example depicted in FIG. 3, row $58_1$ is the active row, and row $58_2$ is the next available row for programming.

In some embodiments of the invention, the fuse bank 50 includes a multiplexer 65 (a pass gate multiplexer or a tristate multiplexer, etc., as examples) that has output terminals to provide the indications of the stored value to the fuse bus 100 in response to a read operation that targets the fuse memory location. The multiplexer 65 has multiple bit sets of input terminals 60. Each set, in turn, is connected to one of the rows 58. The select input terminals of the multiplexer 65 receive the select signals 76 that are generated by the decoder 150. The selection by the multiplexer 65 is controlled (via the decoder 150) by the logical states of the status fuses 56. Thus, for the example depicted in FIG. 3, the multiplexer 65 selects, or electrically connects to, row $58_1$ (the active programmed row 58) and provides indications of the fuses of this row to the fuse bus 100 during a read operation that targets the fuse memory location. The multiplexer 65 is electrically disconnected from the non-selected rows 58.

Although not shown in FIG. 3, in some embodiments of the invention, the multiplexer 65 may include sensing read circuitry that is coupled to the selected fuse row 58 for purposes of converting the high/low resistance state of each fuse of the row 58 into a corresponding signal indicative of the fuse's logical state.

Figure 4:
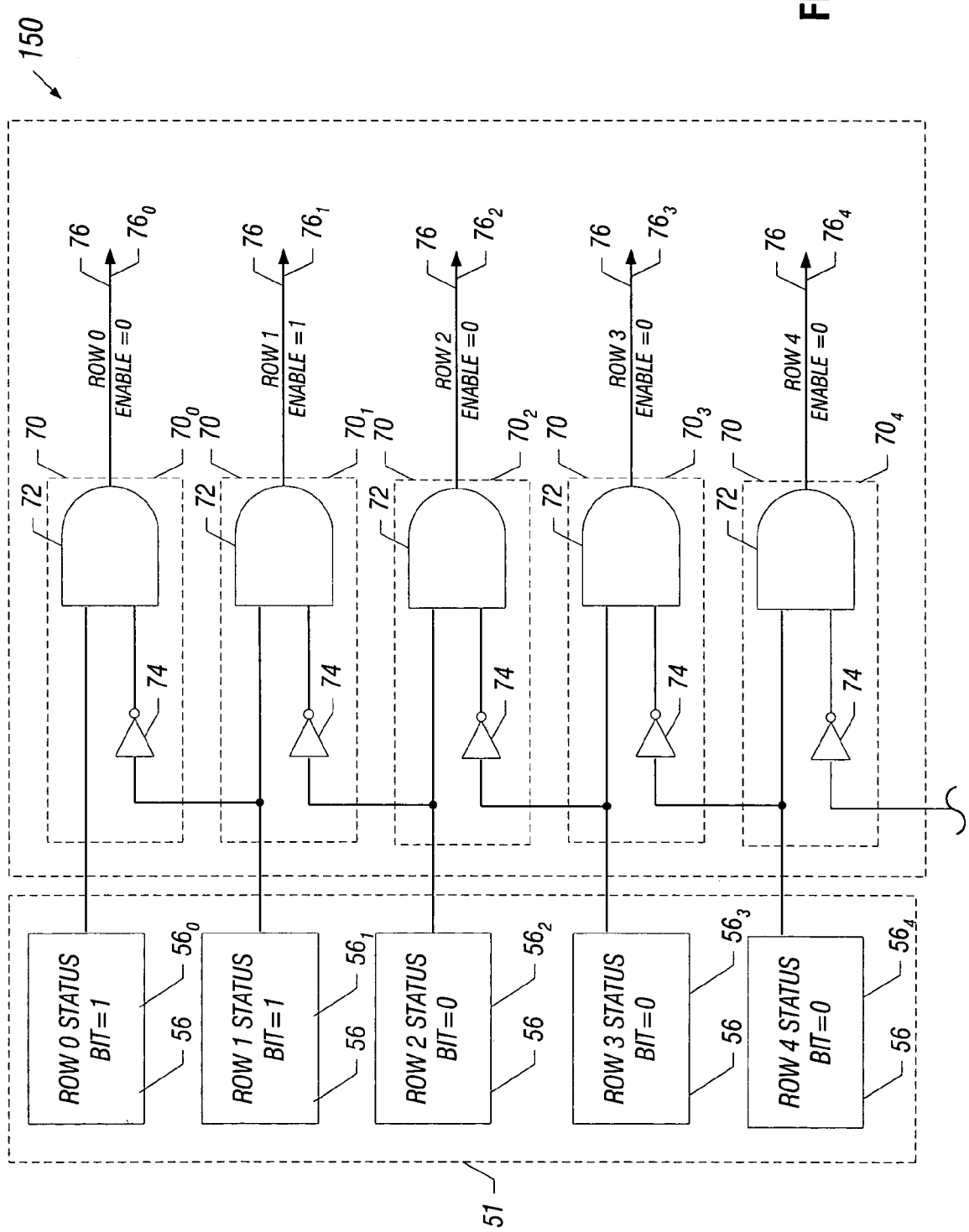
FIG. 4 is a schematic diagram depicting a portion of the circuitry of FIG. 2 in more detail according to an embodiment of the invention.

In some embodiments of the invention, the decoder 150 (see FIG. 4) may have an architecture that is generally depicted in FIG. 4. The decoder 150 provides N select lines 76 (output lines $76_0$, $76_1$, $76_2$, $76_3$ and $76_4$, depicted as examples), each of which communicates a signal produced by a corresponding logic circuit 70 (logic circuits $70_0$, $70_1$, $70_2$, $70_3$ and $70_4$, depicted as examples). Each one of the logic circuits 70 responds to the state of a particular status fuse 56 and the next status fuse 56 in sequence. For example, the logic circuit $70_1$ receives an input signal from the status fuse $56_1$ and receives an input signal from the next status fuse $56_2$ in sequence. Similarly, the logic circuit $70_3$ receives an input signal from the status fuse $56_3$ and receives an input signal from the next fuse $56_4$ in sequence.

The select lines 76 indicate the particular row 58 that is currently active. In some embodiments of the invention, each output 76 has a deasserted state (a logic zero state, for example) if the associated status fuse 56 (and thus, the associated row 58) is either programmed and not currently active or has never been programmed. However, the select line 76 communicates an asserted signal (a signal having a logic one state, for example) if the associated status fuse 56 (and thus, the associated row 58) is associated with the current active row 58. Thus, in some embodiments of the invention, the select line 76 that communicates the sole asserted signal identifies the current active row 58.

Due to this encoding scheme, the multiplexer 65 (used in read operations) and the fuse programming circuit 102 (used in write operations) respond in the following manner to the select signals 76. In response to a read operation, the multiplexer 65 selects the input terminals 60 of the row 58 that is associated with the sole asserted select line 76 and electrically connects these input terminals 60 to the fuse bus 100. In response to a write operation, the fuse programming circuit 102 (FIG. 2) does not select the row 58 that is associated with the sole asserted select line 56, but rather, the fuse programming circuit 102 selects the next row 58 in sequence for programming. For the example depicted in FIGS. 3 and 4, for a subsequent write operation to the memory location, row $58_1$ is the row associated with the asserted select signal 76. Thus, the fuse programming circuit 102 selects row $58_2$ (the next row in sequence) to be reprogrammed with the new value.

In some embodiments of the invention, each logic circuit 70 may include, for example, an AND gate 72. The output terminal of the AND gate 72 is connected to the select line 76; one input terminal of the AND gate 72 is connected to receive a signal indicative of the state of the associated status fuse 56; and another input of the AND gate 72 is connected to the output of an inverter 74. The input terminal of the inverter 74, in turn, is connected to receive a signal that is indicative of the logical state of the next status fuse 56 in sequence. Thus, as a more specific example, for the logic circuit $70_1$, one input of the AND gate 72 is connected to receive a signal indicative of the status of the fuse $56_1$; and the input terminal of the inverter 74 is connected to receive a signal indicative of the state of the status fuse $56_2$.

Figure 5:
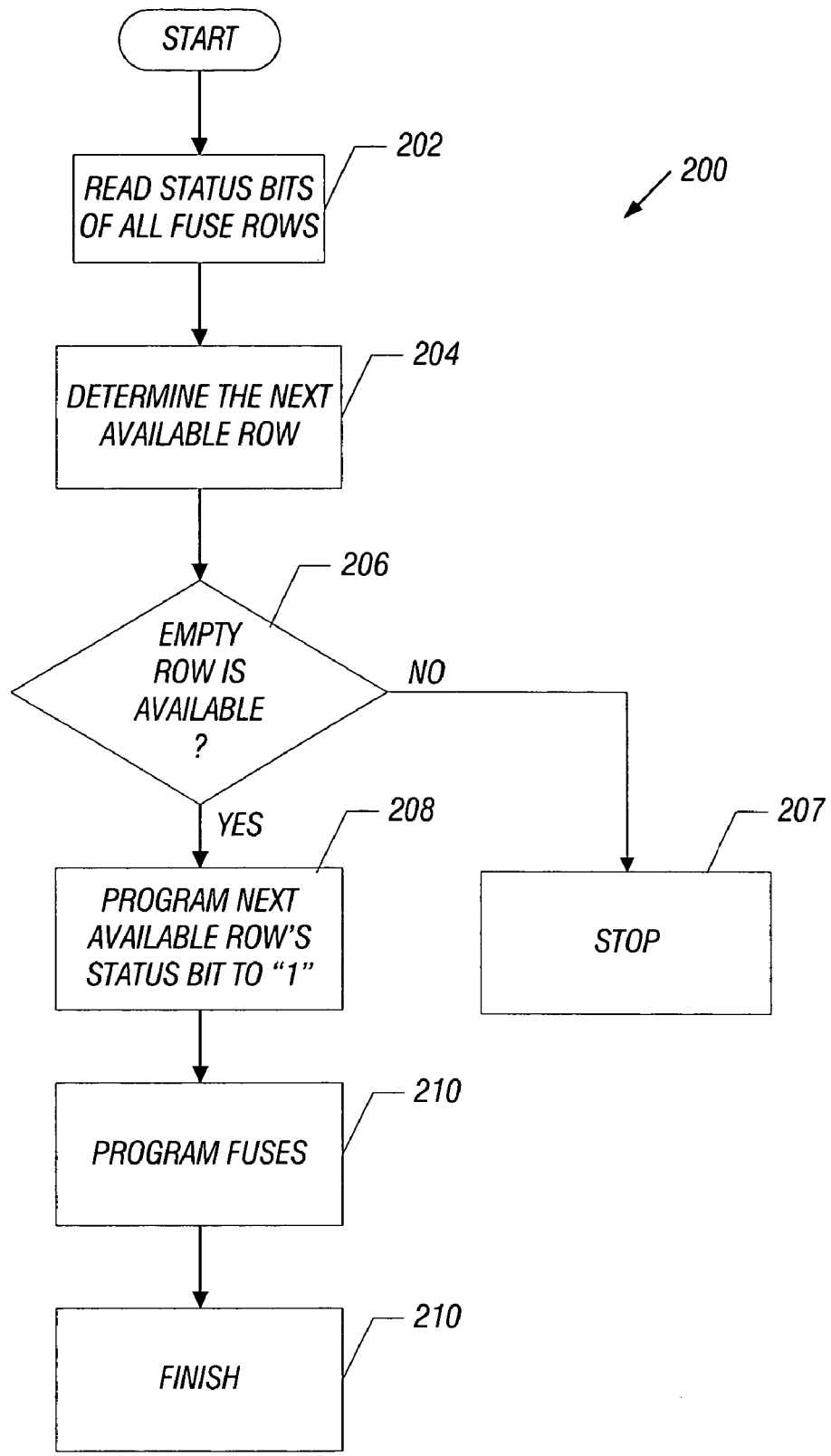
FIG. 5 is a flow diagram depicting a technique to write to a fuse memory location according to an embodiment of the invention.

In some embodiments of the invention, a technique 200 that is depicted in FIG. 5 may be used for purposes of rewriting a particular fuse memory location. Pursuant to the technique 200, the technique 200 includes reading (block 202) the status bits 56 of all of the fuse rows 58. Next, the technique 200 includes determining (block 204) the next available row 58 for programming. If it is determined (diamond 206) that an empty row is available, then control proceeds to block 208. Otherwise, the fuse bank 50 can no longer be programmed and control proceeds to stop, as indicated in block 204.

If a row is available for programming, then the technique 200 includes programming (block 208) the status fuse 56 of the associated next row 58 for programming to a predetermined logical state (a logical state of one, for example), and then, the technique 200 includes programming (block 210) the corresponding next available row 58, as depicted in block 210. In some embodiments of the invention, the fuse programming circuit 102 may perform all of the technique 200. In other embodiments of the invention, the processing core 110 (i.e., a "processor") may execute instructions 114 (see FIG. 2) to perform one or more of the above-described blocks of the technique 200. For example, in some embodiments of the invention, the processing core 110 may use a write operation over the bus 100 to specifically target and write to one of the status fuses 56 to change the status of the targeted fuse 56 to being programmed. In other embodiments of the invention, the fuse programming circuit 100 automatically updates the status fuses 56 in response to a write operation to a fuse memory location without requiring a write operation that specifically targets a status fuse 56. Other variations are possible.

While the invention has been disclosed with respect to a limited number of embodiments, those skilled in the art, having the benefit of this disclosure, will appreciate numerous modifications and variations therefrom. It is intended that the appended claims cover all such modifications and variations as fall within the true spirit and scope of the invention.

What is claimed is:

1. A method comprising:
   rewriting a fuse memory location, comprising:
   communicating an address identifying the fuse memory location and data to be stored in the fuse memory location; and
   replacing a first programmed fuse with a second fuse and programming the second fuse to store the data in the fuse memory location.

2. The method of claim 1, wherein the replacing comprises:
   electrically disconnecting the first programmed fuse from an electrical line that indicates a value for the memory location; and
   electrically connecting the second fuse to the electrical line.

3. The method of claim 1, wherein the first programmed fuse is part of a first set of fuses and the second fuse is part of a second set of fuses, the method further comprising:

replacing the first set of fuses with the second set of fuses to reprogram the fuse memory location.

4. The method of claim 1, further comprising:
selecting the second fuse from a set of unprogrammed fuses.

5. The method of claim 4, wherein the selection is based at least in part on a stored value indicating the second fuse is unprogrammed.

6. The method of claim 1, further comprising:
storing an indication to designate that the second fuse is programmed.

7. The method of claim 1, further comprising:
using the fuse memory location to configure a portable device.

8. An article comprising a computer readable storage medium storing instructions to cause a processor-based system to:
program a first fuse associated with a fuse memory location to store data in the fuse memory location, the fuse memory location being identified by an address separate from the data;
store a value in another memory location to indicate that the first fuse has been programmed; and
cause the first fuse to be replaced with another fuse in response to the fuse memory location being rewritten to rewrite the data stored in the fuse memory location.

9. The article of claim 8, wherein
the first fuse is one of a set of fuses, and
the second fuse indicates that the set of fuses have been programmed.

10. The article of claim 8, wherein said another memory location comprises another fuse memory location.

11. An article comprising a computer readable storage medium storing instructions to cause a processor-based system to:
cause communication of an address identifying a fuse memory location and data over a bus;
replace a first programmed fuse with a second fuse and program the second fuse to store the data in the fuse memory location.

12. The article of claim 11, the storage medium storing instructions to cause the processor-based system to:
electrically disconnect the first programmed fuse from an electrical line that indicates a value for the memory location and electrically connect the second fuse to the electrical line to replace the first programmed fuse with the second fuse.

13. The method of claim 11, wherein the first programmed fuse is part of a first set of fuses and the second fuse is part of a second set of fuses, the storage medium storing instructions to cause the processor-based system to:
replace the first set of fuses with the second set of fuses to reprogram the fuse memory location.

14. The article of claim 11, the storage medium storing instructions to cause the processor-based system to:
select the second fuse from a set of unprogrammed fuses.

15. The article of claim 11, the storage medium storing instructions to cause the processor-based system to:
store an indication to designate that the second fuse is programmed.

16. An apparatus comprising:
a first fuse;
a second fuse; and
a circuit to:
use the first fuse to indicate a first value for a fuse memory location, and
in response to the fuse memory location being rewritten in a write operation that includes communication of an address identifying the fuse memory location and a second value separate from the address, use the second fuse to indicate the second value for the fuse memory location.

17. The apparatus of claim 16, wherein the circuit electrically disconnects the first fuse from a memory output line and electrically connects the second fuse to the memory output line in response to the fuse memory location being rewritten.

18. The apparatus of claim 16, wherein the first fuse is one out of a first set of fuses and the second fuse is part of a second set of fuses, wherein the circuit uses the first set of fuses to indicate the first stored value for the fuse memory location, and in response to the fuse memory location being rewritten use the second set of fuses to indicate the second stored value for the fuse memory location.

19. The apparatus of claim 16, wherein the circuit comprises:
a decoder to select the second fuse from a set of unprogrammed fuses.

20. The apparatus of claim 19, wherein the decoder selects the second fuse in response to a stored value indicating the second fuse is unprogrammed.

21. An apparatus comprising:
a first fuse to at least partially indicate data for a fuse memory location, the fuse memory location being identified with an address separate from the data;
a spare fuse to replace the first fuse in response to the fuse memory location being rewritten to rewrite the data; and
a status fuse to indicate that the first fuse is being used to at least partially indicate the data.

22. The apparatus of claim 21, wherein the first fuse is one of a plurality of fuses to indicate the data for the fuse memory location.

23. The apparatus of claim 21, wherein the spare fuse is one of a plurality of spare fuses.

24. The apparatus of claim 21, further comprising:
a previously programmed fuse associated with the fuse memory location.

25. The apparatus of claim 21, further comprising:
a decoder to indentify the spare fuse in response to the status fuse; and
a fuse programming circuit to reprogram the fuse memory location in response to the indication from the decoder.

26. A system comprising:
a wireless interface;
a first fuse;
a second fuse; and
a circuit to:
use the first fuse to indicate a first value for a fuse memory location, and
in response to the fuse memory location being rewritten in a write operation that includes communication of an address identifying the fuse memory location and second value separate from the address, use the second fuse to indicate the second value for the fuse memory location.

27. The system of claim 26, wherein the wireless interface comprises an antenna.

28. The system of claim 26, further comprising:
a processor to initiate a rewrite of the fuse memory location.

29. The system of claim 26, wherein the wireless interface comprises a cellular network interface.

30. The system of claim 26, wherein
the first fuse is one out of a first set of fuses and the second fuse is part of a second set of fuses, and
the circuit uses the first set of fuses to indicate the first value for the fuse memory location and in response to the fuse memory location being rewritten uses the second set of fuses to indicate the second value for the fuse memory location.

* * * * *